(12) United States Patent
Yang et al.

(10) Patent No.: US 7,384,486 B2
(45) Date of Patent: Jun. 10, 2008

(54) CHAMBER CLEANING METHOD

(75) Inventors: Ming-Ho Yang, Chu-bei (TW);
Liang-Gei Yao, Hsin-chu (TW);
Shih-Chang Chen, Hsin-Chu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 838 days.

(21) Appl. No.: 10/810,106

(22) Filed: Mar. 26, 2004

(65) Prior Publication Data

US 2005/0214454 A1 Sep. 29, 2005

(51) Int. Cl.
*B08B 3/12* (2006.01)
(52) U.S. Cl. .................... 134/1; 134/1.3; 427/255.28; 427/249.15; 216/96; 216/99
(58) Field of Classification Search ........... 427/255.28, 427/249.15; 134/1, 1.3; 216/96, 99
See application file for complete search history.

(56) References Cited

U.S. PATENT DOCUMENTS

| | | | | |
|---|---|---|---|---|
| 5,546,890 A * | 8/1996 | Tamaki et al. | ............... | 117/102 |
| 5,746,834 A * | 5/1998 | Hanley | ............... | 118/715 |
| 5,872,017 A * | 2/1999 | Boydston et al. | ............... | 438/17 |
| 6,003,526 A * | 12/1999 | Lo et al. | ............... | 134/1.1 |
| 6,176,936 B1 * | 1/2001 | Taguwa | ............... | 134/2 |
| 6,236,023 B1 * | 5/2001 | Savas et al. | ............... | 219/390 |
| 6,368,567 B2 * | 4/2002 | Comita et al. | ............... | 423/240 R |
| 6,863,019 B2 * | 3/2005 | Shamouilian et al. | ............... | 118/723 R |
| 7,064,073 B1 * | 6/2006 | U'ren | ............... | 438/706 |
| 2006/0211248 A1 * | 9/2006 | Brabant et al. | ............... | 438/689 |

OTHER PUBLICATIONS

Uchida, K., "Novel chamber cleaning method using atomic hydrogen generated by hot catalyzer". Thin Solid Films ☐☐vol. 395, Issues 1-2, Sep. 3, 2001, pp. 75-77.*

* cited by examiner

*Primary Examiner*—Bret Chen
(74) *Attorney, Agent, or Firm*—Thomas, Kayden, Horstemeyer & Risley

(57) ABSTRACT

A method for cleaning a process chamber in such a manner that chamber-cleaning chemicals or agents are incapable of remaining in the chamber after cleaning and chemically interfering with semiconductor fabrication or other processes subsequently carried out in the chamber. The method includes providing a repellant coating layer having a hydrophobic or hydrophilic polarity on the interior surfaces of a process chamber and using a cleaning agent having a polarity opposite that of the repellant coating layer to clean the chamber. Accordingly, the cleaning agent removes post-processing chemical residues from the interior chamber walls and other surfaces and is incapable of adhering to the surfaces and remaining in the chamber upon commencement of a subsequent process carried out in the chamber.

20 Claims, 1 Drawing Sheet

CHAMBER CLEANING METHOD

FIELD OF THE INVENTION

The present invention relates to chemical vapor deposition (CVD) technology used in the deposition of material layers such as polysilicon in the fabrication of polygates on a semiconductor wafer substrate. More particularly, the present invention relates to a novel method for the cleaning of a CVD chamber to prevent residual HCl chamber cleaning gas from remaining in the chamber and rendering silicon unstable in the fabrication of a polygate stack on a high-k dielectric material.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include sequential deposition of conductive and insulative layers on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove material from one or more conducting layers from the areas not covered by the mask, thereby etching the conducting layer or layers in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. Additional techniques, such as dual damascene processes, are used to form conductive vias which establish electrical contact between vertically-spaced conductive lines or layers in the circuits. The finished semiconductor product includes microelectronic devices including transistors, capacitors and resistors that form the integrated circuits on each of multiple die on a single wafer.

In the semiconductor industry, CMOS (complementary metal-oxide semiconductor) technology is extensively used in the fabrication of IC devices. CMOS technology typically involves the use of overlying layers of semiconductor material with the bottom layer being a dielectric layer and the top layer being a layer of doped silicon material that serves as a low-resistivity electrical contact gate electrode. The gate electrode, also referred to as a gate stack, typically overlies the dielectric layer.

In the semiconductor fabrication industry, silicon oxide ($SiO_2$) is frequently used for its insulating properties as a gate oxide or dielectric. As the dimensions of device circuits on substrates become increasingly smaller, the gate dielectric thickness must decrease proportionately in field effect transistors (FETs) to approximately 3 to 3.5 nonometers. Accordingly, device performance and reliability can be adversely affected by such factors as interfacial defects, defect precursors and diffusion of dopants through gate dielectrics, as well as unintended variations in thickness in the gate oxide layer among central and peripheral regions of the layer.

Two types of CMOS device structures which are commonly fabricated in semiconductor technology include the MOSCAP (metal oxide semiconductor capacitor) structure and the MOSFET (metal oxide semiconductor field effect transistor) structure. Both of these structures include a substrate on which is deposited a dielectric layer having a high dielectric constant (k), such as a pad oxide layer. A silicon-containing gate, or gate stack, is deposited on the dielectric layer and connects a pair of trench oxide layers (in the case of a MOSCAP structure) or source and drain regions (in the case of a MOSFET structure).

One gate stack fabrication technique involves the deposition of polycrystalline silicon (polysilicon) on the high-k dielectric layers of multiple substrates simultaneously in a vertical process furnace to form the gate stack on each substrate. Such a deposition process requires a relatively high thermal budget (620 degrees C. at a process time of typically about 1.5 hours). Another technique involves the deposition of amorphous silicon on the dielectric layer in a process furnace to form the gate stack on each of the multiple substrates. Compared to the polysilicon deposition process, the deposition of amorphous silicon has a lower thermal budget (550 degrees C. at a process time of typically about 2 hours). Therefore, due to the relatively lower thermal budget of the amorphous silicon deposition process in the furnace processing of multiple substrates, amorphous silicon has a higher stability than polysilicon when deposited as a gate stack on a dielectric layer having a high dielectric constant.

Formation of a gate stack on a pad oxide layer in fabrication of both the MOSCAP and MOSFET structures is currently carried out typically on single substrates using chemical vapor deposition (CVD) in a CVD process chamber. In the fabrication of MOSCAP and MOSFET structures, polysilicon or amorphous silicon is deposited on a high-k dielectric layer in a CVD process chamber. Polysilicon is deposited on the dielectric layer at a temperature of typically about 675 degrees C. for a process time of about 1 minutes. Amorphous silicon, on the other hand, is deposited on the dielectric layer at a temperature of typically about 575 degrees C. for about 10 min. This is accomplished by reacting hafnium dioxide ($HfO_2$) with silicon (Si) to form silicon oxides (SiOx), according to the following equation:

$$HfO_2 + Si\text{--}\Delta\text{-->} HfO_2\text{-}x + SiOx$$

Ideally, the silicon oxides are deposited in an even layer over the high-k dielectric layer to form the high-stability gate stack structure. However, it has been found that in spite of the lower thermal budget of the amorphous silicon deposition process, the amorphous silicon is less stable than the polysilicon in single-wafer processing applications due to unintended chemical reactions between the hafnium dioxide and cleaning agent used to clean the process chamber.

During gate stack fabrication, some of the silicon oxide residues accumulate on the interior surfaces of the process chamber. Accordingly, at regular intervals, the CVD process chamber must be subjected to a chamber-cleaning procedure to remove the residues of silicon oxides from the interior chamber walls. The chamber-cleaning procedure typically uses HCl gas as the cleaning agent. Because the interior walls of the process chamber are typically made of a hydrophilic material such as quartz, however, residual quantities of hydrophilic HCl tend to adhere to the interior surfaces of the chamber walls.

After each chamber cleaning, some of the residual HCl remains in the chamber upon commencement of subsequent amorphous silicon gate stack fabrication. Consequently, the $HfO_2$ reacts with residual HCl in the chamber according to the following equation:

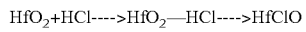

$$HfO_2 + HCl \longrightarrow HfO_2\text{---}HCl \longrightarrow HfClO$$

The $HfO_2$ reacts with residual HCl and silicon according to the following equation:

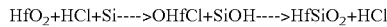

$$HfO_2 + HCl + Si \longrightarrow OHfCl + SiOH \longrightarrow HfSiO_2 + HCl$$

Consequently, quantities of SiOH (silicon hydroxide) and $HfSiO_2$ (hafnium silicon dioxide) are deposited on the dielectric layer, contaminating and rendering unstable the amorphous silicon gate stack. As a result, the structural and functional integrity of the gate stack is compromised, resulting in leakage of the gate stack and CV (capacitance-versus-voltage) failure. Accordingly, a method is needed to clean a CVD process chamber in such a manner as to prevent residual HCl from remaining in the chamber after chamber cleanings and rendering a silicon-containing gate stack unstable during subsequent gate stack fabrication.

An object of the present invention is to provide a novel method for the cleaning of a process chamber in such a manner as to enhance the stability of gate stacks fabricated on substrates in the chamber.

Another object of the present invention is to provide a novel chamber cleaning method which in one embodiment may include providing a repellant coating layer having a hydrophobic or hydrophilic polarity on the interior surfaces of a process chamber and using a cleaning agent having a polarity opposite to that of the repellant coating layer to clean the chamber.

Still another object of the present invention is to provide a novel chamber cleaning method which may be adapted to a variety of process chambers for a variety of semiconductor fabrication or other processes.

Yet another object of the present invention is to provide a novel chamber cleaning method which may render a material deposition process carried out in a process chamber amenable to producing a silicon-containing gate stack layer of enhanced stability on a substrate.

A still further object of the present invention is to provide a novel chamber cleaning method which may include providing a repellant silicon coating layer having a hydrophobic polarity on the interior surfaces of a process chamber and using a hydrophilic cleaning agent such as HCl to clean the chamber and prevent residual cleaning agent from remaining in the chamber after cleaning.

SUMMARY OF THE INVENTION

In accordance with these and other objects and advantages, the present invention is generally directed to a novel method for cleaning a process chamber in such a manner that chamber-cleaning chemicals or agents are incapable of remaining in the chamber after cleaning and chemically interfering with semiconductor fabrication or other processes subsequently carried out in the chamber. The method includes providing a repellant coating layer having a hydrophobic or hydrophilic polarity on the interior surfaces of a process chamber and using a cleaning agent having a polarity opposite that of the repellant coating layer to clean the chamber. Accordingly, the cleaning agent removes post-processing chemical residues from the interior chamber walls and other surfaces and is incapable of adhering to the surfaces and remaining in the chamber upon commencement of a subsequent process carried out in the chamber.

According to the method of the invention, the repellent coating layer for the interior surfaces of the chamber is hydrophobic silicon (Si). In another embodiment, the repellent coating layer is hydrophobic silicon carbide (SiC). Typically, the cleaning agent used for the chamber-cleaning procedure is hydrophilic HCl. However, other repellent coating layers and cleaning agents of opposite polarity may be used.

BRIEF DESCRIPTION OF THE DRAWING

The invention will now be described, by way of example, with reference to the accompanying drawings, in which.

DETAILED DESCRIPTION OF THE INVENTION

Figure 1:
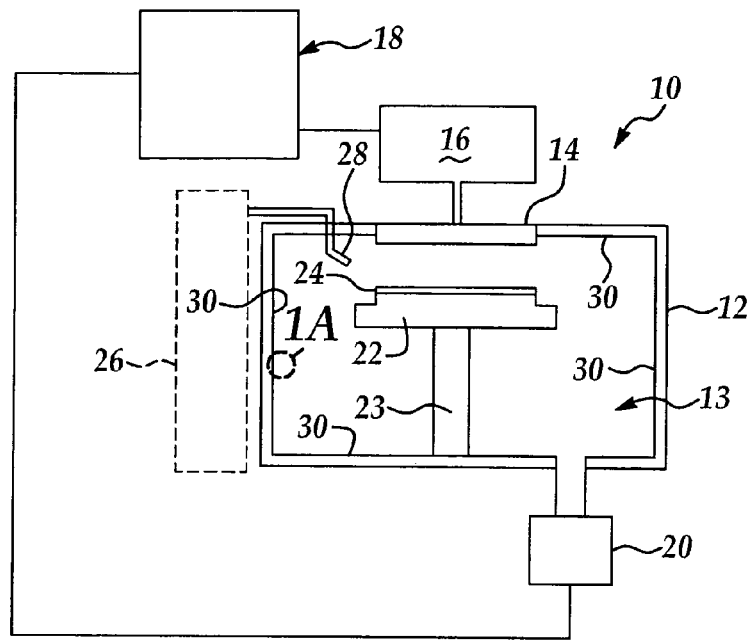
FIG. 1 is a schematic of a CVD process chamber in accordance with the method of the present invention.

The present invention has particularly beneficial utility in the cleaning of physical vapor deposition (PVD) chambers used to deposit a silicon-containing layer on a high-k dielectric layer in the fabrication of a gate stack, particularly in MOSCAP (metal oxide semiconductor capacitor) structures and MOSFET (metal oxide semiconductor field effect transistor) structures on semiconductor wafer substrates. However, the invention is not so limited in application and is equally applicable to semiconductor IC fabrication processes in general as well as other industrial processes.

The present invention is generally directed to a method which includes providing a repellant coating layer on the interior surfaces of a process chamber to prevent residual etchant chamber cleaning chemicals or agents from remaining in the chamber after periodic chamber cleanings carried out to remove material deposits from the interior surfaces of the chamber. The repellant coating layer has a hydrophobic or hydrophilic polarity which repels an etchant cleaning chemical or agent having a polarity opposite that of the repellant coating layer. Consequently, the cleaning chemical or agent is substantially incapable of adhering to the interior chamber surfaces and remaining in the chamber to chemically interfere with subsequent processes carried out in the chamber.

In one embodiment according to the method of the invention, the repellent coating layer for the interior surfaces of the chamber is silicon (Si). In another embodiment, the repellent coating layer is silicon carbide (SiC). The cleaning agent used for the chamber-cleaning procedure may be a hydrophilic etchant cleaning gas such as HCl, for example. The hydrophilic HCl or other cleaning gas is repelled by the hydrophobic silicon or silicon carbide, which prevents residual HCl or other cleaning gas from remaining in the process chamber upon subsequent commencement of substrate processing in the chamber.

In one embodiment, the repellent coating layer has a thickness of typically from about 2 μm to about 20 μm on the interior surfaces of a process chamber. Preferably, the repellent coating layer has a thickness of typically at least about 10 μm. A repellent coating layer of at least about 2 μm on the interior chamber surfaces is conducive to fabricating a gate stack of amorphous silicon on a high-k dielectric material with optimum CV (capacitance-versus-voltage) characteristics. Furthermore, a repellent coating layer having a thickness of at least about 5 μm on the interior chamber surfaces raises the stability of amorphous silicon to acceptable levels when the deposition process temperature is raised to 600 degrees C. A repellant coating layer of 10 μm is conducive to fabrication of gate stack structures having a failure rate of 0%.

In one embodiment, silane ($SiH_4$) is used as the precursor source gas for deposition of a silicon repellent coating layer on the interior chamber surfaces. In another embodiment, trimethylsilane [$Si(CH_3)_3H$] is used as the precursor source gas for deposition of a silicon carbide repellent coating layer on the interior chamber surfaces. Typical process conditions for formation of the repellent coating layer are as follows: chamber temperature (about 500 to about 700 degrees C.); chamber pressure (about 10 Torr to about 760 Torr, or 1 atmosphere); process time (about 0.5 min. to about 10 min.).

Referring to FIG. 1, a typical CVD process chamber 10 suitable for implementation of the present invention is shown. The chamber 10 includes a chamber wall 12 that defines a chamber interior 13. A gas distribution plate or "showerhead" 14 is provided in the top of the chamber 10 for the introduction of process gases from a gas panel 16 into the chamber interior 13, by actuation of a control unit 18. A vacuum pump 20 is provided in gas communication with the chamber interior 13 for the evacuation of gases therefrom. A pedestal support 23, on which is provided a pedestal 22 for supporting a substrate 24, is upward-standing in the chamber interior 13. The chamber 10 may be further equipped with temperature control features used to control the temperature of the pedestal 22 and substrate 24 resting thereon, as is known by those skilled in the art. The showerhead 14 and the pedestal 22 also form a pair of spaced-apart electrodes. When an electric field is generated between the electrodes, the process gases introduced into the chamber 10 are ignited into a plasma. Typically, the electric field is generated by connecting the pedestal 22 to a source of radio frequency (RF) power (not shown) through a matching network (not shown). Alternatively, the RF power source and matching network may be coupled to the showerhead 14 or to both the showerhead 14 and the pedestal 22. Optionally, a remote plasma source 26 may be provided in communication with the chamber interior 13 to provide a remotely-generated plasma to the chamber interior 13, typically through a chamber inlet 28 that extends into the chamber interior 13.

In typical operation, a substrate 24 is initially placed on the pedestal 22. Deposition gases are introduced into the chamber interior 13 through the showerhead 14 and ignited to form a plasma which contacts the substrate 24 to deposit material layers thereon. In the fabrication of gate stack structures which are characteristic of MOSCAP (metal oxide semiconductor capacitor) structures and MOSFET (metal oxide semiconductor field effect transistor) structures, for example, amorphous silicon or polysilicon is deposited on a high-k dielectric material layer. During the deposition process, silicon residues become deposited on the interior surfaces, including those of the chamber wall 12, of the chamber 10. Typically, these silicon residues are removed by introducing etchant HCl or other etchant cleaning gas into the chamber interior 13 through the showerhead 14, such that the HCl or other etchant cleaning gas contacts the interior surfaces of the chamber 10 and removes the silicon residues from those surfaces to eliminate or minimize the risk of contaminating devices that are being fabricated on the substrate 24. However, since the chamber walls 12 are typically hydrophilic quartz, residual quantities of the HCl or other etchant cleaning gas adhere to the chamber walls 12 and other interior surfaces of the chamber 10. Consequently, the residual HCl or other etchant cleaning gas remains in the chamber 10 and interferes with subsequent CVD deposition processes carried out on the substrate 24 in the chamber 10, as heretofore described.

Figure 1A:
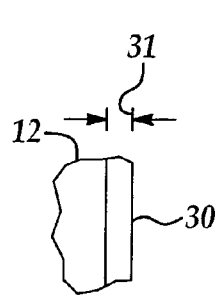
FIG. 1A is an enlarged sectional view, taken along section line 1A in FIG. 1, of a portion of a CVD process chamber wall and a repellent coating layer provided on the inner surface of the wall.
Figure 2:
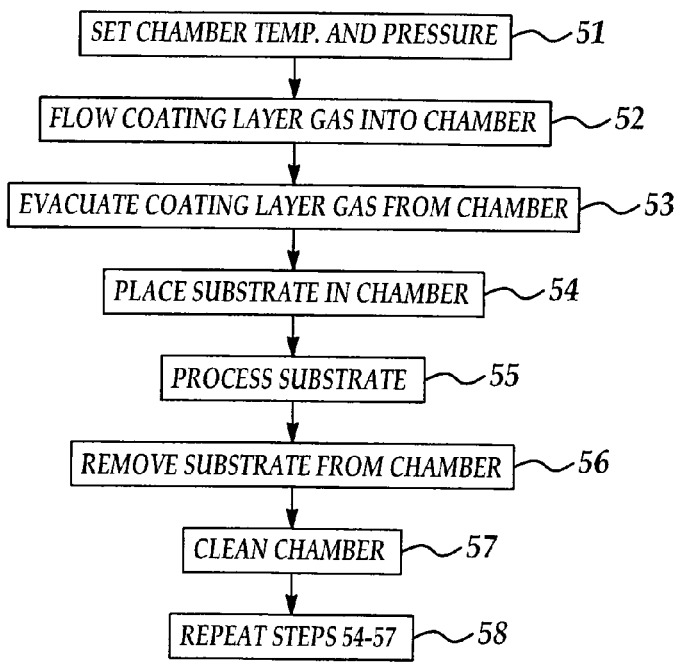
FIG. 2 is a process flow diagram which illustrates a typical process flow in implementation of the method of the present invention.

Referring to FIGS. 1, 1A and 2, in accordance with the method of the present invention, a repellent coating layer 30 is deposited on the interior surfaces of the process chamber 10, as follows. As indicated in step S1 of FIG. 2, the chamber 10 is initially set to the proper chamber temperature and pressure necessary for the layer-coating process. In typical application, the chamber 10 is set at a temperature of typically from about 500 degrees C. to about 700 degrees C. and a pressure of typically from about 10 Torr to about 760 Torr, or 1 atmosphere. Next, as shown in step S2, the coating layer gas is introduced into the chamber interior 13 typically through the showerhead 14, at a flow rate of typically about 300 sccm. In one embodiment, in which the repellent coating layer 30 is silicon (Si), the coating layer gas is silane ($SiH_4$). In another embodiment, in which the repellent coating layer 30 is silicon carbide (SiC), the coating layer gas is trimethylsilane [$Si(CH_3)_3H$]. The coating layer gas remains in the chamber interior 13 for a period of from typically about 0.5 min. to about 10 min., during which time the silicon or silicon carbide coats the interior surfaces, including the chamber walls 12, with the repellent coating layer 30. As shown in FIG. 1A, the repellent coating layer 30 preferably has a thickness 31 of typically from about 2 μm to about 10 μm.

As indicated in step S3 of FIG. 2, after the repellent coating layer 30 has been deposited on the interior surfaces of the chamber 10, layer-forming silane or methylsilane gas remaining in the chamber 10 is evacuated therefrom typically by operation of the vacuum pump 20. Accordingly, the chamber 10 is seasoned or primed for CVD processing of substrates 24 therein, and a substrate 24 is placed on the pedestal 22, as shown in step S4, for processing, as shown in step S5. In the fabrication of a gate stack in a MOSCAP or MOSFET structure, for example, amorphous silicon is deposited on a high-k dielectric material. The process parameters of such fabrication are known by those skilled in the art. After completion of the CVD process, the substrate 24 is removed from the chamber 10, as shown in step S6.

During the CVD deposition process of step S5, amorphous silicon residues form on the interior surfaces of the chamber 10. These residues must be cleaned from the chamber 10 after the CVD process and prior to processing of further substrates 24 in the chamber 10, as shown in step S7. Cleaning of the chamber 10 typically includes introducing HCl or other etchant cleaning gas into the chamber interior 13 through the showerhead 14, as heretofore described, to etch the amorphous silicon residues from the interior surfaces of the chamber 10. These etched residues are evacuated from the chamber 10, with the effluent gas, typically by operation of the vacuum pump 20.

As the etchant HCl or other etchant gas contacts the repellant coating layer 30, the repellant coating layer, typically having a hydrophobic polarity, repels the oppositely-polarized, hydrophilic HCl or other etchant gas, preventing the HCl or other gas from adhering to the repellent coating layer 30. As a result, the HCl or other etchant gas remains in a gaseous state and is evacuated from the chamber interior 13 by operation of the vacuum pump 20 upon completion of the chamber-cleaning procedure. As indicated in step S8, steps S4-S7 can then be repeated, beginning with placement of another substrate 24 on the pedestal 22 for CVD processing. When subsequent substrates 24 are processed in the chamber 10, no residual HCl remains in the chamber interior 13 to interfere with deposition of the amorphous silicon on the dielectric layer or substrate, due to the presence of the repellent coating layer 30 having a polarity which is opposite that or the HCl or other etchant cleaning gas.

While HCl is commonly used as the etchant gas for cleaning the CVD process chamber 10, it is understood that the present invention is equally adaptable for use with alternative etchant gases. This includes etchant gases having a hydrophobic, rather than hydrophilic, polarity. Under circumstances in which the etchant gas used to clean the process chamber 10 has a hydrophobic polarity, the repellent coating layer 30 has a hydrophilic polarity which repels the hydrophobic etchant gas and prevents the etchant gas from remaining in the process chamber 10 to chemically interfere with processes carried out in the chamber.

While the preferred embodiments of the invention have been described above, it will be recognized and understood that various modifications can be made in the invention and the appended claims are intended to cover all such modifications which may fall within the spirit and scope of the invention.

What is claimed is:

1. A method of cleaning a process chamber having interior surfaces, comprising the steps of:
   providing a repellent coating layer of first polarity on said interior surfaces of said process chamber;
   placing a substrate in said process chamber;
   depositing a material film on said substrate and on said repellent coating layer on said interior surfaces;
   removing said substrate with said material film from said process chamber; and
   cleaning said material film on said interior surfaces of said process chamber by introducing a cleaning gas of second polarity opposite said first polarity into said process chamber;
   wherein, after the step of cleaning, at least part of said repellent coating layer is present on said interior surfaces.

2. The method of claim 1 wherein said first polarity is a hydrophobic polarity and said second polarity is a hydrophilic polarity.

3. The method of claim 1 wherein said repellent coating layer has a thickness of at least about 2 µm.

4. The method of claim 3 wherein said first polarity is a hydrophobic polarity and said second polarity is a hydrophilic polarity.

5. The method of claim 1 wherein said repellent coating layer is silicon.

6. The method of claim 5 wherein said repellent coating layer has a thickness of at least about 2 µm.

7. The method of claim 1 wherein said repellent coating layer is silicon carbide.

8. The method of claim 7 wherein said repellent coating layer has a thickness of at least about 2 µm.

9. A method of cleaning a process chamber having interior surfaces, comprising the steps of:
   providing a repellent coating layer of first polarity having a thickness of from about 2 µm to about 10 µm on said interior surfaces of said process chamber;
   placing a substrate in said process chamber;
   depositing a material film on said substrate and on said repellent coating layer on said interior surfaces;
   removing said substrate with said material film from said process chamber; and
   cleaning said material film on said interior surfaces of said process chamber by introducing a cleaning gas of second polarity opposite said first polarity into said process chamber;
   wherein, after the step of cleaning at least part of said repellent coating layer is present on said interior surfaces.

10. The method of claim 9 wherein said first polarity is a hydrophobic polarity and said second polarity is a hydrophilic polarity.

11. The method of claim 9 wherein said providing a repellent coating layer on said interior surfaces of said process chamber comprises the steps of setting said process chamber at a temperature of from about 500 degrees C. to about 700 degrees C. and a pressure of from about 10 Torr to about 760 Torr and introducing a layer-forming gas into said process chamber.

12. The method of claim 9 wherein said repellent-coating layer is silicon.

13. The method of claim 12 wherein said providing a repellent coating layer on said interior surfaces of said process chamber comprises the steps of setting said process chamber at a temperature of from about 500 degrees C. to about 700 degrees C. and a pressure of from about 10 Torr to about 760 Torr and introducing silane gas into said process chamber.

14. The method of claim 9 wherein said repellent-coating layer is silicon carbide.

15. The method of claim 14 wherein said providing a repellent coating layer on said interior surfaces of said process chamber comprises the steps of setting said process chamber at a temperature of from about 500 degrees C. to about 700 degrees C. and a pressure of from about 10 Torr to about 760 Torr and introducing tri-methyl silane gas into said process chamber.

16. A method of cleaning a process chamber having interior surfaces, comprising the steps of:
   providing a repellent coating layer of first polarity having a thickness of at least about 5 µm on said interior surfaces of said process chamber;
   placing a substrate in said process chamber;
   depositing a material film on said substrate and on said repellent coating layer on said interior surfaces;
   removing said substrate with said material film from said process chamber; and
   cleaning said material film on said interior surfaces of said process chamber by introducing a cleaning gas of second polarity opposite said first polarity into said process chamber;
   wherein, after the step of cleaning, at least part of said repellent coating layer is present on said interior surfaces.

17. The method of claim 16 wherein said first polarity is a hydrophobic polarity and said second polarity is a hydrophilic polarity.

18. The method of claim 16 wherein said providing a repellent coating layer on said interior surfaces of said process chamber comprises the steps of setting said process chamber at a temperature of from about 500 degrees C. to about 700 degrees C. and a pressure of from about 10 Torr to about 760 Torr and introducing a layer-forming gas into said process chamber.

19. The method of claim 16 wherein said repellent-coating layer is silicon.

20. The method of claim 16 wherein said repellent-coating layer is silicon carbide.

* * * * *